United States Patent [19]
Koozer

[11] Patent Number: 5,162,744
[45] Date of Patent: Nov. 10, 1992

[54] METHOD OF DETERMINING SETTLING TIME OF A DEVICE UNDER TEST

[75] Inventor: Harvey W. Koozer, Milpitas, Calif.

[73] Assignee: National Semiconductor Corporation, Santa Clara, Calif.

[21] Appl. No.: 780,695

[22] Filed: Oct. 18, 1991

[51] Int. Cl.$^5$ .................. G01R 19/12; G01R 29/02
[52] U.S. Cl. .................. 324/618; 324/617; 324/606; 341/120; 307/517
[58] Field of Search .............. 307/359, 360, 362, 516, 307/517, 520; 341/120; 324/606, 617, 618

[56] References Cited

U.S. PATENT DOCUMENTS

| | | | |
|---|---|---|---|
| 3,668,522 | 6/1972 | Ghafghaichi | 324/617 |
| 4,364,045 | 12/1982 | Spiegel | 341/120 |
| 4,795,963 | 1/1989 | Ueno | 341/120 |

OTHER PUBLICATIONS

Sheingold: "Analog-Digital Conversion Handbook'-Analog Devices-Norwood-Mass.-1972 edition-pp. II-116 to 127.

Primary Examiner—Kenneth A. Wieder
Assistant Examiner—Jose M. Solis
Attorney, Agent, or Firm—Townsend and Townsend

[57] ABSTRACT

Settling time of an electrical device under test in response to a step wave input voltage is determined by first establishing first and second output voltage levels which differ from a settled output voltage level by preestablished voltage differentials, and then determining the time after applying a step wave voltage to the device under test when the output voltage equals the first and second voltages. A voltage controlled oscillator is utilized in triggering the step wave voltage generator and in enabling a voltage comparator whereby the period of the voltage control oscillator is a measure of the settling time of the device under test.

8 Claims, 4 Drawing Sheets

METHOD OF DETERMINING SETTLING TIME OF A DEVICE UNDER TEST

BACKGROUND OF THE INVENTION

This invention relates generally to the testing of semiconductor circuit products such as operational amplifiers, and more particularly the invention relates to a method of determining settling time of such a product.

The response time of an electrical circuit such as a semiconductor integrated circuit in providing an output signal in response to an input signal is an important consideration in many circuit applications. As signal frequencies increase, response time of signal processing circuitry must increase. Thus, circuit products must be characterized during manufacturing testing to determine operating parameters of the circuits. In testing operational amplifiers, for example, the response of an amplifier to a square wave input is determined by the slew rate (slope) and the settling time of an output signal.

Heretofore, sampling voltage trackers have been employed to track an output signal in response to the step input. By using a strobed comparator, the output voltage is measured at increasing periods of time after a reference time ($t_0$) when the square wave is applied. The falling edge of a precisely delayed latch enable (LE) pulse must be placed at a single point on the output wave form and the voltage read with a digital voltmeter. The reading is stored, the LE is incremented, and another reading is made and stored. The process of repetitively incrementing the LE signal and taking readings is time consuming.

An improved method of determining slew rate is to determine the times after a reference time ($t_0$) at which the output voltage reaches two different intermediate voltage levels, and dividing the change in voltage by change in time. The technique does not depend on initial voltage and only two measurements are required. The sampling times for measuring the intermediate voltages are readily established using a voltage controlled oscillator for triggering the input step voltage and strobing a voltage amplifier.

SUMMARY OF THE INVENTION

The present invention is directed to a similar technique in determining settling time. Rather than making many measurements of an output signal following application of an input signal, the settled output voltage before slew and the settled output voltage after slew are determined and then the times at which the output voltage is a voltage increment, $\Delta V$, above or below the settled voltage are determined. Thus, only five measurements are required in determining settling time and characterization of the performance of manufactured circuits.

The invention is readily implemented using a voltage controlled oscillator for triggering an input step voltage and strobing a comparator to locate the settling times. Settling time then becomes a function of the frequency and period of the voltage controlled oscillator.

Accordingly, an object of the invention is an improved method of characterizing settling time of an electrical circuit.

Another object of the invention is improved apparatus for determining the time at which an output signal reaches a predetermined voltage level relative to a settled voltage.

The invention and objects and features thereof will be more readily apparent from the following detailed description and appended claims when taken with the drawings.

DETAILED DESCRIPTION OF THE ILLUSTRATIVE EMBODIMENTS

Figure 1A:
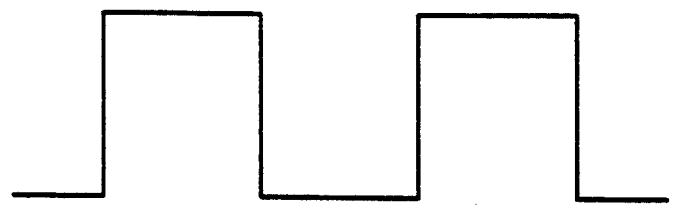
FIGS. 1A-1C illustrate a square wave input signal, an output, and a difference signal.
Figure 1B:
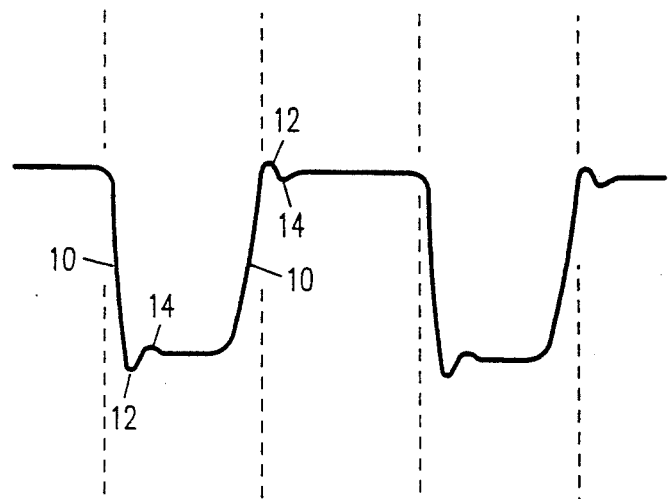
Figure 1C:
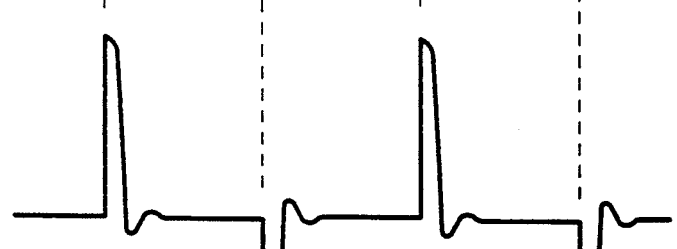

FIGS. 1A-1C illustrate a square wave input signal, a slewed output signal, and a difference signal, respectively, as used in determining settling time of an electrical circuit in accordance with one embodiment of the invention. Assuming that the input signal shown in FIG. 1A is a true square wave with 90° slope on the rise and fall of the wave, the output signal shown in FIG. 1B will have a certain amount of slew or slope as shown at 10 and a certain amount of overshoot and undershoot as shown at 12 and 14, respectively, in response to the square wave input signal. Characterization of an electrical product such as operational amplifier depends on determining the slope or slew 10 and the settling time for the output signal.

As described above, in the prior art a sampling voltage tracker has been employed for device characterization by actually measuring the output signal at a plurality of sampling points following a time reference. This has been accomplished by strobing the sampling voltage tracker whereby the falling edge of a precisely delayed latch enable (LE) pulse is at a single point on the wave form, and the output of the tracker is then measured with a digital voltmeter. By reading and storing the measured output voltage as the latch enable pulse is time incremented, the output of the circuit can be plotted. Obviously, this is a time consuming operation and redundant information is acquired.

Figure 2:
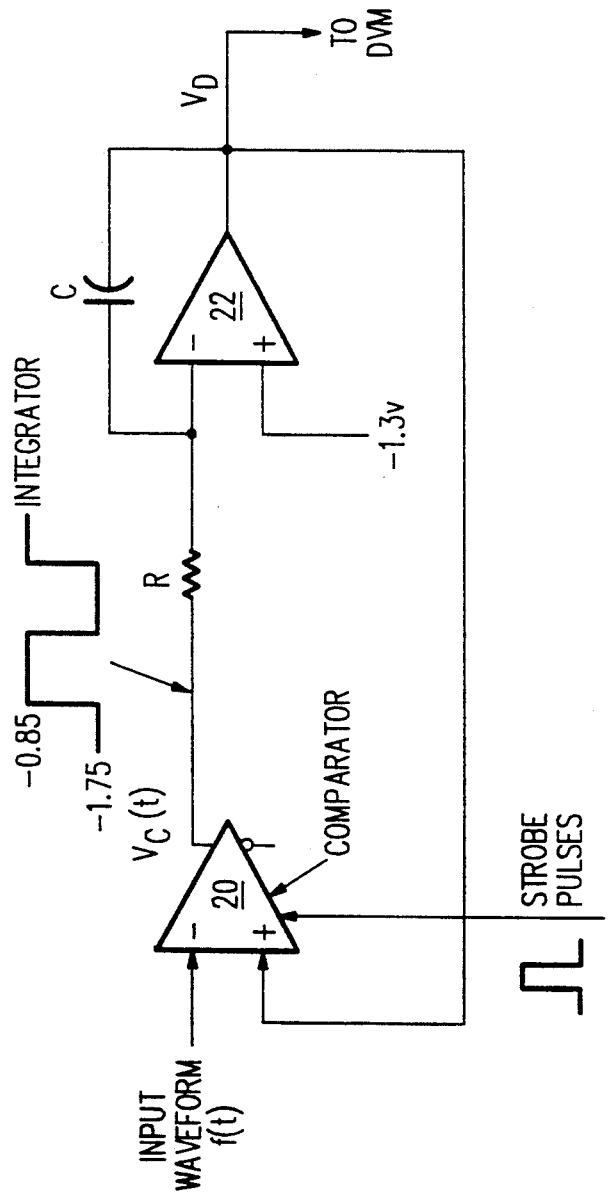
FIG. 2 is a schematic of a sampling voltage tracker in accordance with prior art.

FIG. 2 is a schematic of a sampling voltage tracker heretofore used in tracking an output voltage in response to a square input voltage and determining settling time. A voltage comparator 20 receives the output of a device under test as an input to one terminal and the output of an integrator 22 as the other input. The comparator is strobed at a set period of time after a reference, and the output of the comparator is then applied to the integrator 22 which establishes a voltage level at the strobed period. The voltage from the integrator is measured and stored for different periods following the reference time to thereby establish the output signal characteristics of the device under test.

In accordance with the present invention the settling time of a device is determined by establishing the settled output voltage before slew, the settled output voltage after slew, a time reference at the beginning of output slew following an input step signal, and the time for the output to reach the settled voltage $\pm \Delta V$. In carrying out the invention in accordance with a preferred embodiment, a false summing node method is employed whereby the difference between the input signal and the output signal is established as shown in FIG. 1C.

Figure 3:
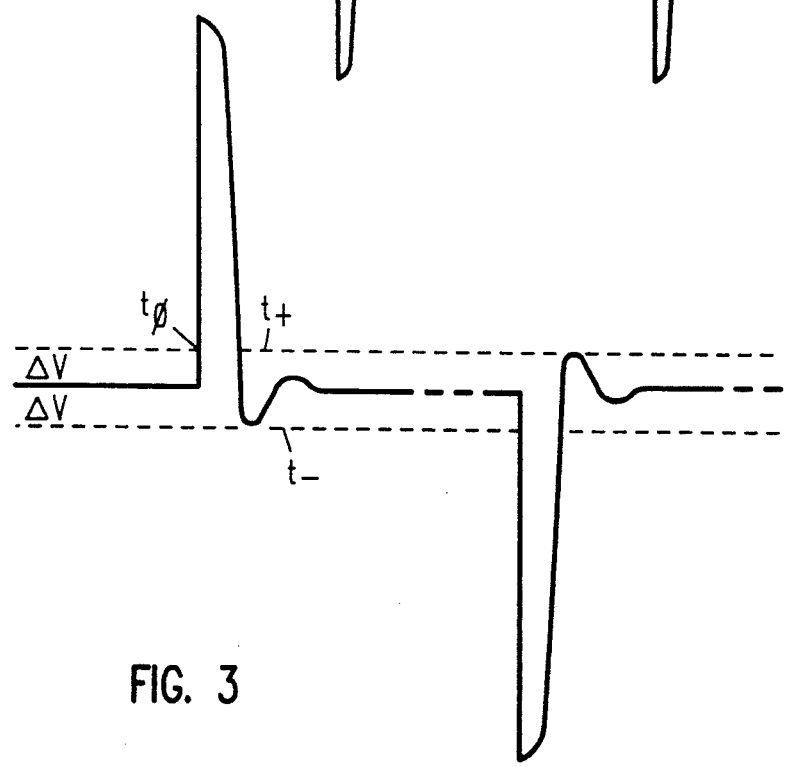
FIG. 3 is an enlarged drawing of the difference signal of FIG. 1C.

FIG. 3 is an enlarged schematic of the difference signal of FIG. 1C and illustrates a reference time, $t_0$, when the output voltage rises $\Delta V$ above the settled output voltage before slew, a time $t+$ when the output voltage is $\Delta V$ greater than the settled voltage after slew, and a time $t-$ when the output voltage is $\Delta V$ less than the settle voltage after slew. The times, $t+$ and $t-$, are the sole measurements required to characterize the settling time of the device under test once the settled output voltages are determined.

Figure 4:
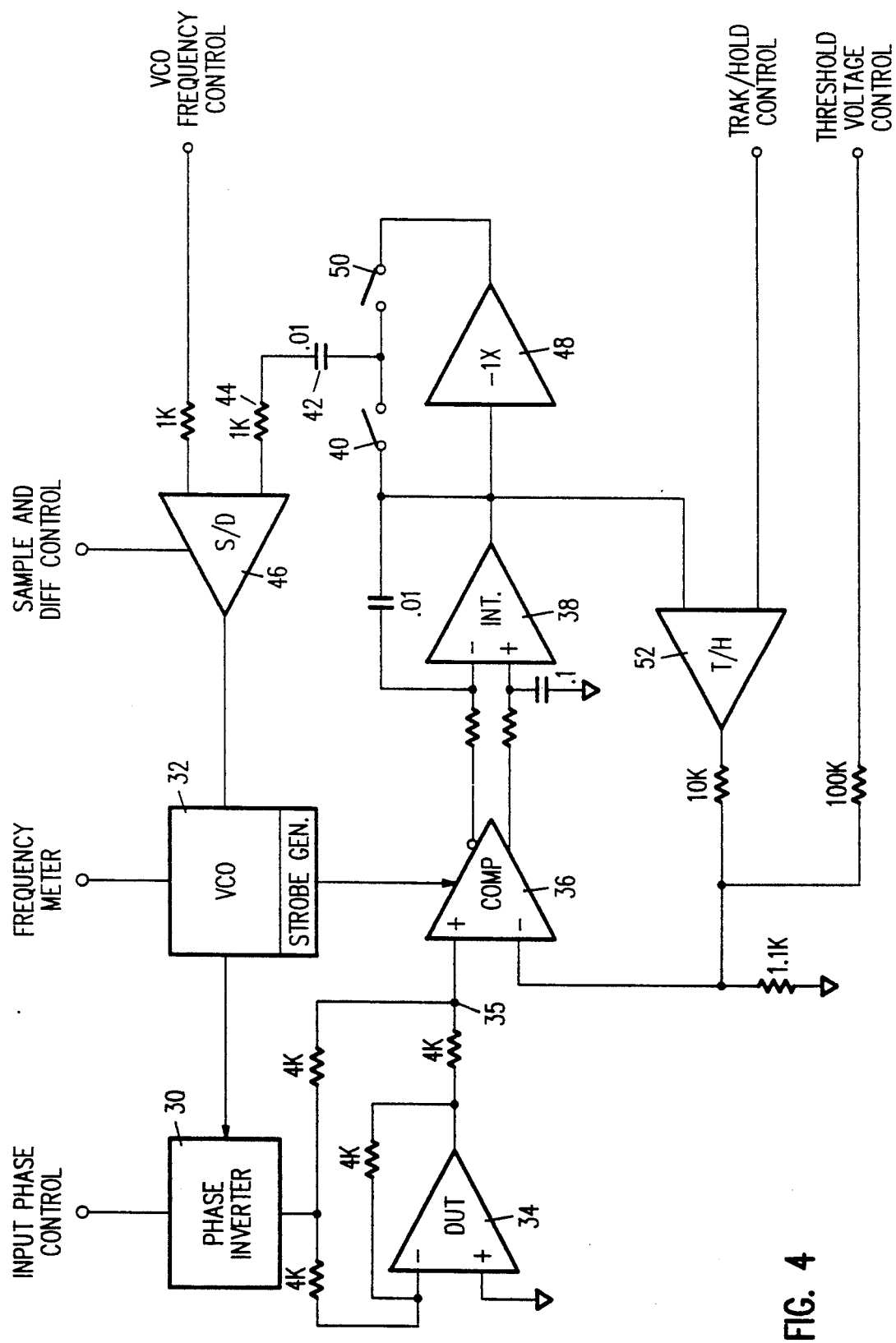
FIG. 4 is a schematic of a sampling voltage tracker useful in carrying out the present invention.

FIG. 4 is a schematic of one embodiment of apparatus for carrying out the settling time determination as described with reference to FIG. 3. In this apparatus the square wave input voltage is generated at 30 in response to a trigger voltage from voltage controlled oscillator 32. The square wave output is applied as an input to the device under test (DUT) 34 and to a false summing node 35 which subtracts the square wave input from the output of the device under test to provide the difference signal illustrated in FIG. 3. The difference signal and a threshold voltage are applied to a comparator 36 with the output of the comparator being applied to integrator 38. The output of integrator 38 can be applied through a switch 40, capacitor 42, and resistor 44 to a sample and hold circuit 46. Alternatively, the output of integrator 38 can be applied through inverting amplifier 48 and switch 50 to the capacitor 42, resistor 44, and sample and hold circuit 46. Either switch 40 or switch 50 will be closed depending on whether the positive voltage at $t+$ or the negative voltage at $t-$ is being tracked.

The output of sample and hold circuit 46 is then applied as a control voltage to the voltage controlled oscillator 32. The trigger pulse to the phase inverter or step generator 30 is derived from the output of the voltage controlled oscillator, and the strobe pulse is derived from the output of a variable pulse width monostable multivibrator which is also triggered by the voltage controlled oscillator. The pulse width of the monostable multivibrator varies in response to the control voltage with the strobe pulse being produced by the time variable monostable nultivibrator output. The frequency of the voltage control oscillator 42 and of the strobe pulse, along with the width of the pulse from the monostable multivibrator, respond to the output voltage of the sample and hold circuit 46 until comparator 36 determines that the input signal from the false summing node equals the threshold voltage applied as the other input. When the comparison is recognized, the frequency and period of the voltage controlled oscillator is determined by a frequency meter from which the time $t+$ and $t-$ can be determined.

Figure 5A:
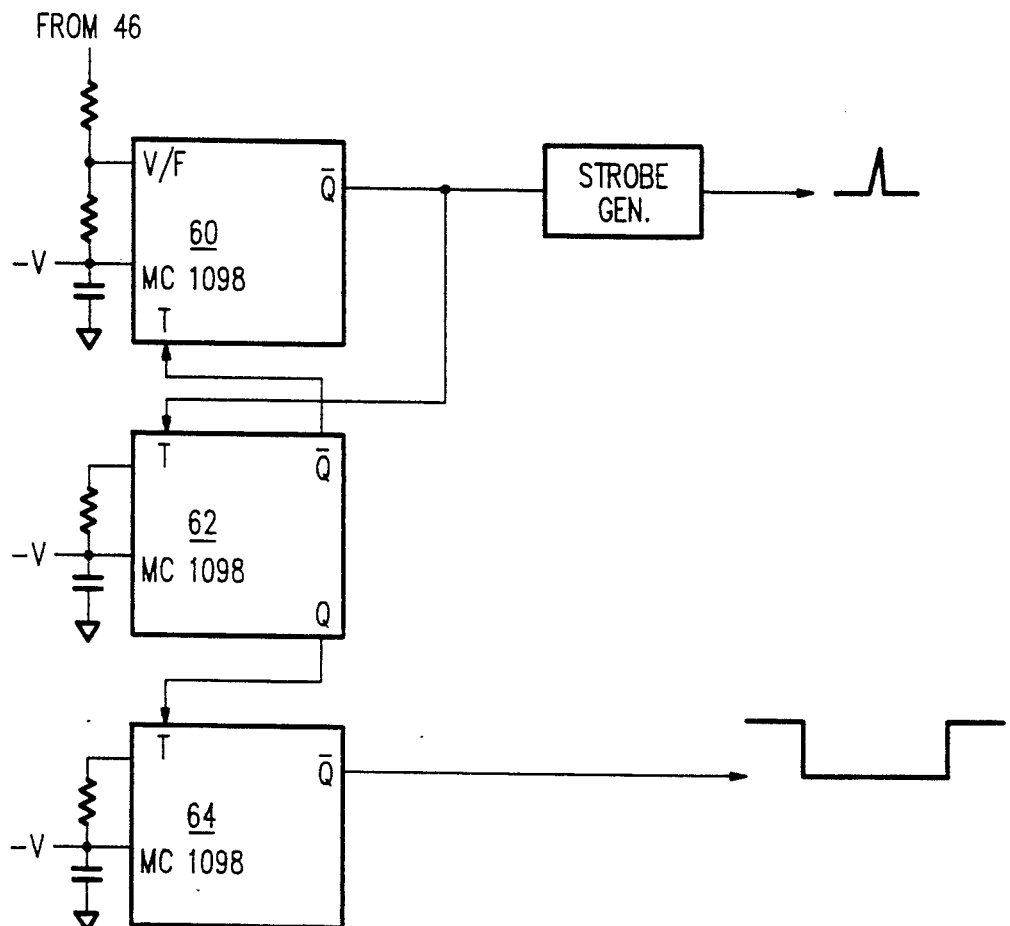
FIG. 5 and FIG. 5B are a schematic of a voltage controlled oscillator and signals therefrom which can be used in practicing the invention.
Figure 5B:
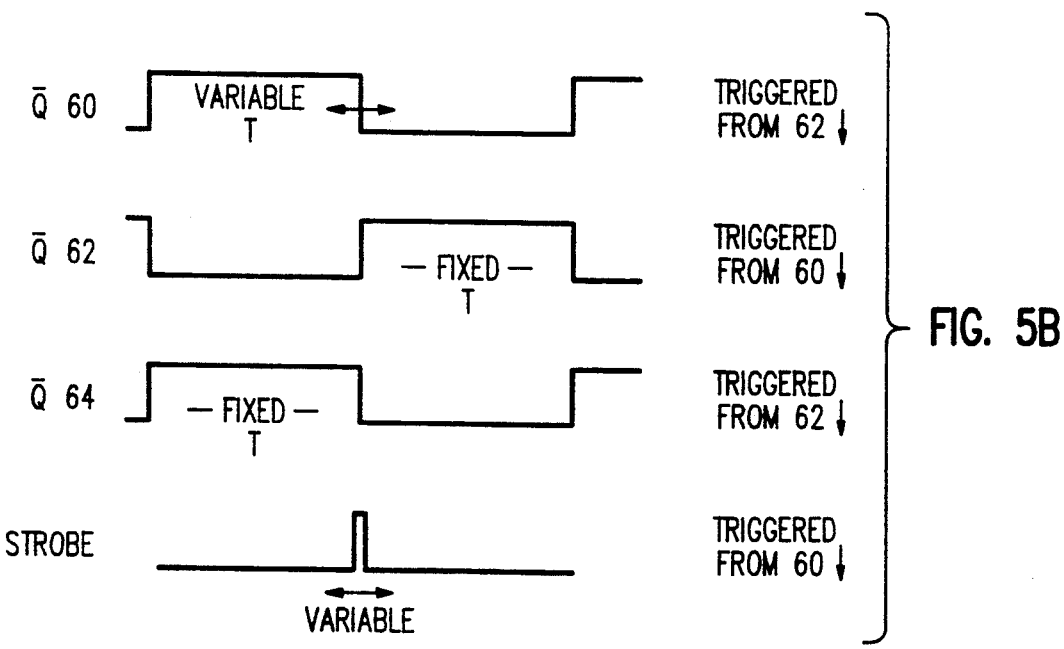

FIG. 5A is a schematic of one embodiment of a voltage controlled oscillator comprising three monostable multivibrators (MMV) 60, 62, 64, and FIG. 5B are signals therein. The voltage from circuit 46 is applied to MMV 60 with the voltage establishing the period of the multivibrator. MMV 62 is triggered by the $\overline{Q}$ output of MMV 60, and MMV 62 triggers MMV 60 and MMV 64. The periods of MMV 60 and MMV 64 are fixed while the period of MMV 62 varies in response to the voltage from circuit 46. A strobe generator 66 (differentiator) responds to the falling edge of $\overline{Q}$ from MMV 60 which varies in time, the phase inverter is triggered by the falling edge of $\overline{Q}$ from MMV 64 which has a fixed period after triggering from MMV 62.

The settled output voltages before slew and after slew are determined by running the circuit as a sampling voltage tracker with the switches 40, 50 open and sample and hold circuit 52 in track mode. The exact placement of the strobe pulse is controlled by the VCO Frequency Control applied to sample and hold circuit 46. For example, for a 2 MHz stepwave frequency having a period of 500 nanoseconds, Vset of $-5$ v places the strobe pulse at a point about 100 nanoseconds before the output signal begins to slew or $t_0$. A Vset of $+5$ v places the strobe pulse at about 400 nanoseconds after $t_0$, when the device under test is sure to have settled. The output voltage above or below the settled voltage is obtained by sampling the settled voltage after slew and then adding to this voltage the $\Delta V$ necessary to determine $t+$ or $t-$. Moving the strobe pulses from initial positions to locate and track the events of interest is accomplished by sample and difference circuitry 46. As noted above the search for $t+$ or $t-$ determines the setting of the switches 40, 50.

Following are specific procedures in determining settled output voltage before and after slew and the times $t_0$, $t+$, $t-$ using the circuit of FIG. 4:

$t_0$ measurement

Set Threshold Voltage Control to 0.00 V
Set VCO frequency control to value necessary to place strobe at settled voltage before slew
Track/Hold control in Track mode
Sample/Difference control in Sample mode
Wait 2 ms for circuit to settle
Track/Hold control in Hold mode
Close switch 40 or switch 50
Wait 0.5 ms for circuit to settle
Sample/Difference control in Difference mode
Set Threshold Voltage Control to settled voltage before slew $\pm \Delta V$
VCO responds to feedback from comparator 36, integrator 38, difference amplifier 46 and changes strobe frequency until output voltage equals Threshold voltage
Measure to when output voltage equals threshold voltage as determined by comparator 36

$t+$, $t-$ measurements

Set Threshold Voltage control to 0.00 V
Set VCO frequency control to value necessary to place strobe at settled voltage after slew
Track/Hold control in Track mode
Sample/Difference control in Sample mode
Wait 2 ms for circuit to settle
Track/Hold control in Hold mode
Close switch 40 or switch 50 depending on $t+$ or $t-$ measurement
Wait 0.5 ms for circuit to settle
Sample/Difference control in Difference mode
Set Threshold Voltage Control to settled voltage after slew $+\Delta V$ for $t+$ or $-\Delta V$ for $t-$
VCO responds to feedback from comparator 36, integrator 38, difference amplifier 46 and changes strobe frequency until output voltage equals threshold voltage
Measure $t+$, $t-$ when output voltage equals threshold voltage as determined by comparator 36

The described invention facilitates the establishment of settling time characterization of electronic circuit products without the need for tracking the transient portion of an output voltage. Only the settled voltage before slew and after slew need be determined, along with an initial reference time for the begin of slew. Settling time is then established by determining when the output reaches a voltage level $\pm \Delta V$ from the settled voltage. Accordingly the characterization process is simplified and shortened in time.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A method of determining settling time of an electrical device under test comprising the steps of
   a) applying a step wave voltage input to said device including triggering a step wave generator by an input from a voltage controlled oscillator,
   b) determining a measure of settled output voltage of said device after applying said step wave voltage,
   c) establishing a first voltage as the settled output voltage plus a first voltage differential and a second voltage as the settled output voltage minus a second voltage differential, and
   d) determining the time when the output voltage reaches said first voltage and when the output voltage reaches said second voltage as a measure of settling time including providing a voltage comparator for comparing a measure of the output voltage to each of said first voltage and said second voltage and incrementing the voltage comparator by a strobe signal from said voltage controlled oscillator after applying the step wave voltage input until the output voltage reaches each of said first voltage and said second voltage.

2. The method as defined by claim 1 wherein step d) includes using the period of the voltage controlled oscillator in determining the time when the output voltage reaches said first voltage and when the output voltage reaches said second voltage.

3. The method as defined by claim 1 wherein step d) includes establishing a reference time, $t_0$ after applying said step wave voltage when the output voltage begins to skew.

4. The method as defined by claim 3 wherein step b) includes determining a measure of settled output voltage of said device before applying said step wave voltage, and step d) includes establishing a reference time, $t_0$ when the output voltage exceeds the measure of settled output voltage of said device before applying said step wave voltage by a third voltage differential.

5. The method as defined by claim 4 wherein said first voltage differential, said second voltage differential, and said third voltage differential are equal.

6. The method as defined by claim 1 wherein step b) includes subtracting the input voltage from the output voltage.

7. The method as defined by claim 1 wherein said first voltage differential and said second voltage differential are the same.

8. The method as defined by claim 7 wherein step b) includes subtracting said input voltage from the output voltage.

* * * * *